(12) United States Patent
Crowley

(10) Patent No.: US 8,182,662 B2
(45) Date of Patent: May 22, 2012

(54) ROTARY CATHODE FOR MAGNETRON SPUTTERING APPARATUS

(75) Inventor: Daniel Theodore Crowley, Owatonna, MN (US)

(73) Assignee: Sputtering Components, Inc., Owatonna, MN (US)

( * ) Notice: Subject to any disclaimer, the term of this patent is extended or adjusted under 35 U.S.C. 154(b) by 390 days.

(21) Appl. No.: 12/413,121

(22) Filed: Mar. 27, 2009

(65) Prior Publication Data

US 2010/0243428 A1 Sep. 30, 2010

(51) Int. Cl.
*C23C 14/00* (2006.01)
*C25B 11/00* (2006.01)
*C25B 13/00* (2006.01)

(52) U.S. Cl. ............................. 204/298.14; 204/298.09

(58) Field of Classification Search ............. 204/298.14, 204/298.09
See application file for complete search history.

(56) References Cited

U.S. PATENT DOCUMENTS

| | | | |
|---|---|---|---|
| 2,320,485 A * | 6/1943 | Straub ........................ | 222/561 |
| 3,617,459 A | 11/1971 | Logan | |
| 3,767,551 A | 10/1973 | Lang, Jr. et al. | |
| 4,014,779 A | 3/1977 | Kuehnle | |
| 4,046,659 A | 9/1977 | Cormia et al. | |
| 4,356,073 A | 10/1982 | McKelvey | |
| 4,417,968 A | 11/1983 | McKelvey | |
| 4,422,916 A | 12/1983 | McKelvey | |
| 4,434,038 A | 2/1984 | Morrison, Jr. | |
| 4,443,318 A | 4/1984 | McKelvey | |
| 4,445,997 A | 5/1984 | McKelvey | |
| 4,519,885 A | 5/1985 | Innis | |
| 4,525,262 A | 6/1985 | Class et al. | |
| 4,904,362 A | 2/1990 | Gaertner et al. | |
| 5,047,131 A | 9/1991 | Wolfe et al. | |
| 5,082,546 A | 1/1992 | Szczyrbowski et al. | |
| 5,096,562 A | 3/1992 | Boozenny et al. | |
| 5,100,527 A | 3/1992 | Stevenson et al. | |
| 5,108,574 A | 4/1992 | Kirs et al. | |
| 5,156,727 A | 10/1992 | Bjornard et al. | |
| 5,169,509 A | 12/1992 | Latz et al. | |
| 5,200,049 A * | 4/1993 | Stevenson et al. ........ | 204/298.22 |
| 5,338,422 A | 8/1994 | Belkind et al. | |
| 5,399,252 A | 3/1995 | Scherer et al. | |
| 5,539,272 A | 7/1996 | Taylor et al. | |
| 5,567,289 A | 10/1996 | Taylor et al. | |
| 5,591,314 A | 1/1997 | Morgan et al. | |

(Continued)

FOREIGN PATENT DOCUMENTS

CA 2089147 7/1991

(Continued)

*Primary Examiner* — Luan V Van
*Assistant Examiner* — Ibrahime A Abraham
(74) *Attorney, Agent, or Firm* — Fogg & Powers LLC

(57) ABSTRACT

A rotary cathode for a magnetron sputtering apparatus is disclosed. The rotary cathode comprises a rotatable target cylinder, and a non-rotatable interior structure in the target cylinder. The interior structure has an outer surface and an inner passageway. An outer passageway is defined between an inner surface of the target cylinder and the outer surface of the interior structure. An end cap is affixed at a distal end of the target cylinder. A rotating aperture is adjacent to an inner surface of the target cylinder at the distal end thereof, with the rotating aperture configured to direct a fluid toward the inner surface at the distal end. A fluid pathway is at least partially defined by the end cap, with the pathway providing fluid communication between the outer passageway and the inner passageway through the rotating aperture.

13 Claims, 14 Drawing Sheets

U.S. PATENT DOCUMENTS

| | | | |
|---|---|---|---|
| 5,725,746 | A | 3/1998 | Dickey et al. |
| 6,375,815 | B1 | 4/2002 | Lynn et al. |
| 6,736,943 | B1 * | 5/2004 | Scobey et al. ............ 204/192.12 |
| 6,841,051 | B2 | 1/2005 | Crowley |
| 2003/0136672 | A1 | 7/2003 | Barrett |
| 2003/0173217 | A1 | 9/2003 | Crowley |
| 2004/0149576 | A1 | 8/2004 | Crowley |
| 2007/0089986 | A1 * | 4/2007 | Richert et al. ............ 204/298.12 |
| 2008/0012337 | A1 | 1/2008 | De Bosscher et al. |
| 2008/0087541 | A1 | 4/2008 | Dellaert et al. |
| 2008/0105543 | A1 | 5/2008 | Dellaert et al. |
| 2008/0202925 | A1 | 8/2008 | Dellaert et al. |

FOREIGN PATENT DOCUMENTS

| | | |
|---|---|---|
| CA | 2094252 | 4/1993 |
| DE | 3229969 | 4/1983 |
| DE | 3636524 | 4/1988 |
| EP | 0134559 | 3/1985 |
| EP | 0546293 | 6/1993 |
| EP | 0701270 | 3/1996 |
| EP | 0543844 | 6/1998 |
| EP | 1092109 | 5/2002 |
| EP | 1856303 | 1/2009 |
| GB | 915568 | 1/1963 |
| GB | 2160898 | 1/1986 |
| JP | 59179782 | 10/1984 |
| JP | 1215975 | 8/1989 |
| JP | 1309965 | 12/1989 |
| JP | 2258976 | 10/1990 |
| WO | 9201081 | 1/1992 |
| WO | 2006094905 | 9/2006 |

* cited by examiner

ROTARY CATHODE FOR MAGNETRON SPUTTERING APPARATUS

BACKGROUND

A magnetron sputtering device is used for depositing thin film layers on a substrate and utilizes a rotary cathode that includes a cylindrical hollow tube with a target material thereon. This target tube is rotated around a stationary magnet array suspended inside of the tube. The magnet array is directed at a substrate in a vacuum chamber and holds processing plasma in a desired location for coating the target material on the substrate. A coolant such as water typically flows inside the target tube for cooling during the sputtering process.

Some target materials need more cooling than others in order to keep them from being damaged. As target materials and rotary targets are very expensive, it is important to maintain their useful life by preventing damage where possible to avoid replacement costs.

It is desirable to put as much coolant as possible back into the cooling system after the cathode has been drained. Coolant, even water, is expensive, and what is lost needs to be replaced. Cooling water is typically de-ionized, and treated with expensive anti-bacterial and anti-corrosion chemicals. The target tubes can be very long, such as up to about 4 meters in length. There can be many of these tubes in one sputtering system (e.g., over 50 in some cases), which amounts to a significant volume of coolant.

In a conventional water fill method for a rotary cathode, water is pumped into the inlet of a rotary feedthru passage on one end of the sputtering device and returned to an outlet at the same end. This is typically done by routing the water thru a central tube that supports the magnet array. The water exits the central tube thru holes along an end portion of the central tube and partially fills the target tube, leaving an air pocket at the top of the target tube.

There are several shortcomings in this conventional water fill method. In a horizontal application, if the magnet array is directed upward for instance ('sputter up'), the magnet array is not totally in the cooling water but is partially in the air pocket. The process plasma, which generates the target heating, is then on the air pocket side of the target. In this case, the power to run the process must be reduced to avoid target damage, resulting in slower processing and thus reduced productivity. Additionally, in the sputter up scenario, if for some reason the target unintentionally stopped rotating, and this was not immediately detected, the target would be quickly destroyed. Not only would the target material be damaged, but the target tube would be bowed from one sided heating.

In addition, the conventional method does not allow for vertical applications. In this case, the air bubble goes to the top of the target tube. Therefore, there is no cooling available for the entire end of the target in that region, resulting in target damage, magnet assembly damage, as well as a potential vacuum leak because of heat damage to the end seal.

When cooling water is to be removed from the target tube in the typical method after the sputtering process, compressed air is used to 'blow down' the target tube. The water flow is shut off, and thru a valve mechanism, compressed air is pushed thru the same path in the rotary feedthru passage and the target tube to remove the water.

It is necessary to remove water from the target tube in order to avoid water spills into the vacuum chamber. Some cathode designs are such that the target tube is removed in the vacuum chamber and water is spilled out into the chamber. This results in added clean-up time, as well as addition time needed to pump all hidden water out of the vacuum chamber, so that the sputtering process can be started up again. This can cost many hours in lost production time, thus, water spills are very expensive.

It also necessary to remove water from the target tube in order to avoid water spills outside of the vacuum chamber. Some cathode designs are such that the target tube is removed from the cathode off line, outside of the vacuum chamber. Often, there are many gallons of water in these assemblies and when disassembled, this water pours out onto the cathode equipment and floor or, if possible, into a specialized water catching tool. This tool is often ineffective in catching all of the water as it gushes out onto the equipment. Dealing with this water and its clean up are inconvenient, time consuming, and raise various safety issues.

As the conventional method of coolant routing makes total water removal in the target tube impossible, all of the above problems occur frequently.

SUMMARY

The present invention is related to a rotary cathode for a magnetron sputtering apparatus. The rotary cathode comprises a rotatable target cylinder with an outer surface and an inner surface, the target cylinder having a proximal end and a distal end. A non-rotatable interior structure is located in the target cylinder and extends from the proximal end to the distal end. An outer passageway is defined between the inner surface of the target cylinder and the outer surface of the interior tube. An end cap is affixed at the distal end of the target cylinder. A rotating aperture is adjacent to the inner surface of the target cylinder at the distal end thereof, with the rotating aperture configured to direct a fluid toward the inner surface at the distal end. A fluid pathway is at least partially defined by the end cap, with the pathway providing fluid communication between the outer passageway and the inner passageway through the rotating aperture.

A magnetron sputtering apparatus according to one embodiment comprises a cathode source assembly including a rotatable hollow drive shaft, and a non-rotatable coolant tube in the hollow drive shaft. A cathode target section is removably coupled to the cathode source section, with the cathode target section including the rotary cathode components described above. During a coolant fill operation for the magnetron sputtering apparatus, the cathode target section is filled with a liquid coolant while the target cylinder is rotating such that substantially all trapped gas is removed from the cathode target section. In a blow down operation, compressed gas is fed into the cathode target section while the target cylinder is rotating such that substantially all trapped liquid coolant is removed from the cathode target section.

BRIEF DESCRIPTION OF THE DRAWINGS

Features of the present invention will become apparent to those skilled in the art from the following description with reference to the drawings. Understanding that the drawings depict only typical embodiments of the invention and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the present invention. The following description is, therefore, not to be taken in a limiting sense.

The present invention is directed to rotary cathode with unique coolant routing features for a magnetron sputtering apparatus that solves the problems of prior coolant routing schemes in conventional cathodes. The present rotary cathode allows substantially all of the water or air to be removed at any cathode orientation during water drain and fill operations. Thus, sufficient cooling is provided to all portions of the cathode in any target orientation (from horizontal to vertical) during a sputtering process, using any magnet assembly orientation in any vacuum chamber.

In the following description, a conventional rotary cathode and its water fill/drain operation are described, followed by the rotary cathode of the invention and its methods of operation.

Figure 1A:
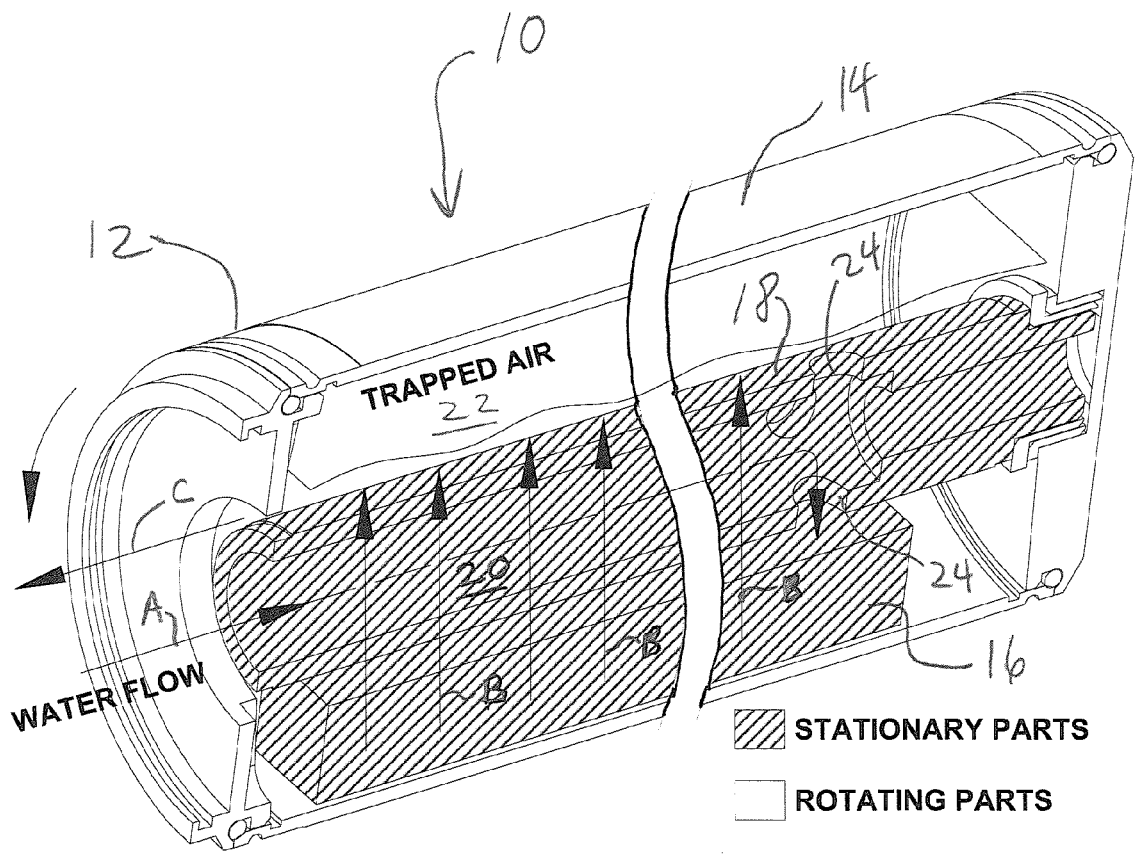
FIGS. 1A and 1B are cross-sectional perspective views of a conventional rotary cathode for a magnetron sputtering apparatus.
Figure 1B:
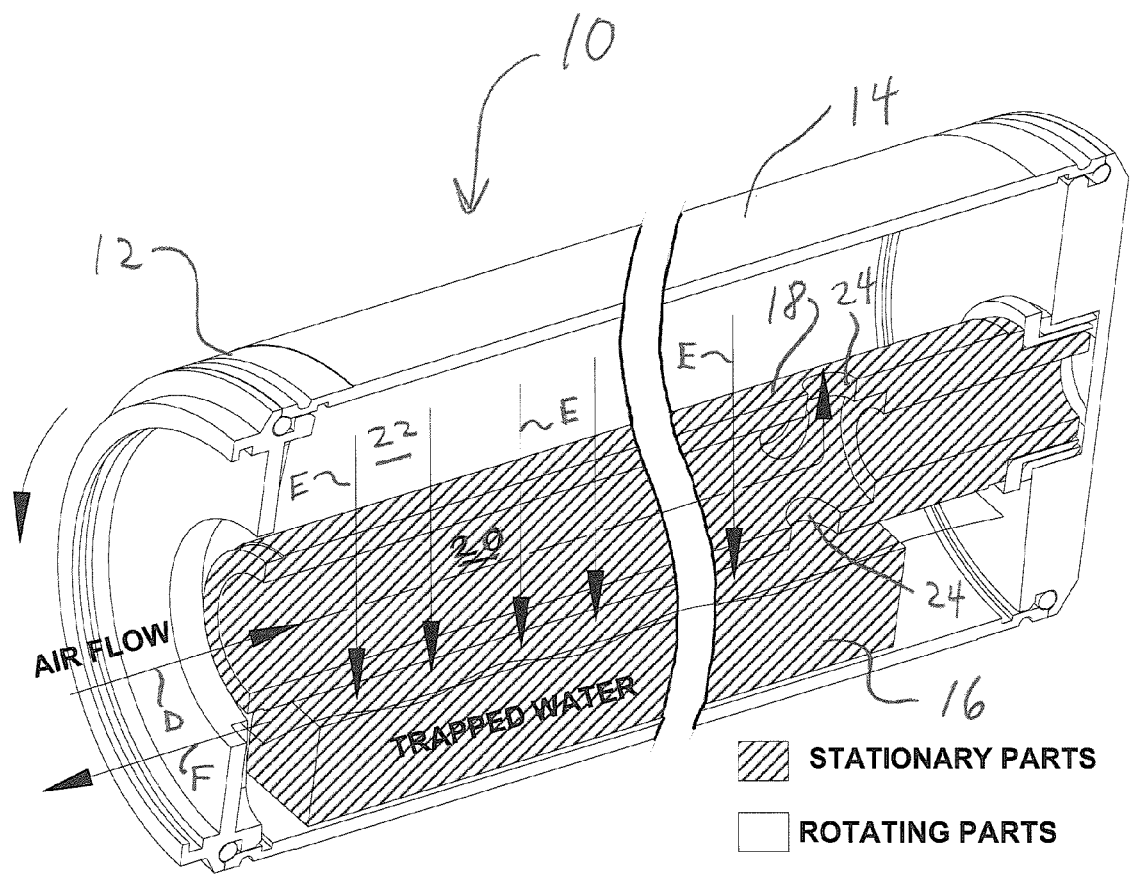

FIGS. 1A and 1B depict a conventional rotary cathode 10 for a magnetron sputtering apparatus in a horizontal orientation. The rotary cathode 10 includes a cylindrical target tube 12 with a target material on an outer surface 14 of target tube 12. The target tube 12 is rotated around a non-rotatable magnet array 16 that is suspended inside of target tube 12 from a central tube 18 having an inner passageway 20. An outer passageway 22 is defined between the interior surface of target tube 12 and the outer surface of central tube 18. A plurality of holes 24 toward one end of central tube 18 provide fluid communication between inner passageway 20 and outer passageway 22.

In a conventional method of filling rotary cathode 10 with water, the water flow is routed thru inner passageway 20 (arrow A) as shown in FIG. 1A. The water flows thru holes 24 in central tube 18 and into outer passageway 22, partially filling the target tube 12 (arrows B). The water is then forced thru an outlet of outer passageway 22 (arrow C), while leaving a pocket of trapped air at the top of outer passageway 22.

FIG. 1B depicts a conventional method of removing water from rotary cathode 10 when the sputtering process is stopped, in which compressed air is used to blow down the water in target tube 12. The air flow is routed thru inner passageway 20 (arrow D), and passes thru holes 24 in central tube 18 into outer passageway 22, as shown in FIG. 1B. The compressed air only partially blows down the water in outer passageway 22 (arrows E). The air forces the water out of the outlet of target tube 12 (arrow F), while leaving a pool of trapped water at the bottom of outer passageway 22.

In the conventional water fill and blow down approaches described above, the trapped air and water cause various problems during and after the sputtering process, as discussed previously. The present rotary cathodes and methods of operation overcome these problems by utilizing a coolant routing scheme in which water for filling the cathode target tube flows in the opposite direction as in the conventional method for a horizontal cathode orientation.

For example, during a water fill operation according to the present method for a horizontal cathode orientation, the water flows into an inlet (which was the outlet in the conventional method discussed above) of the target tube, and then thru an aperture adjacent to an end cap, which is fixed at the end of the target tube. The water flows thru a pathway adjacent to the end cap and then into the end of an interior structure such as a tube, which supports the magnet assembly. The water then travels thru the interior structure and exits an outlet (which was the inlet for the conventional method discussed above). In order to remove the water with the present approach, air is blown into the inlet (which was the outlet in the conventional method) of the target tube. The water is forced out of the target tube thru the aperture adjacent the end cap and flows thru the pathway into the interior structure. The water then travels thru the interior structure and exits at the outlet (which was the inlet for the conventional method).

The various features of the rotary cathode and magnetron sputtering apparatus of the invention are described in further detail as follows with respect to the drawings.

Horizontal Cathode Orientation

Figure 2A:
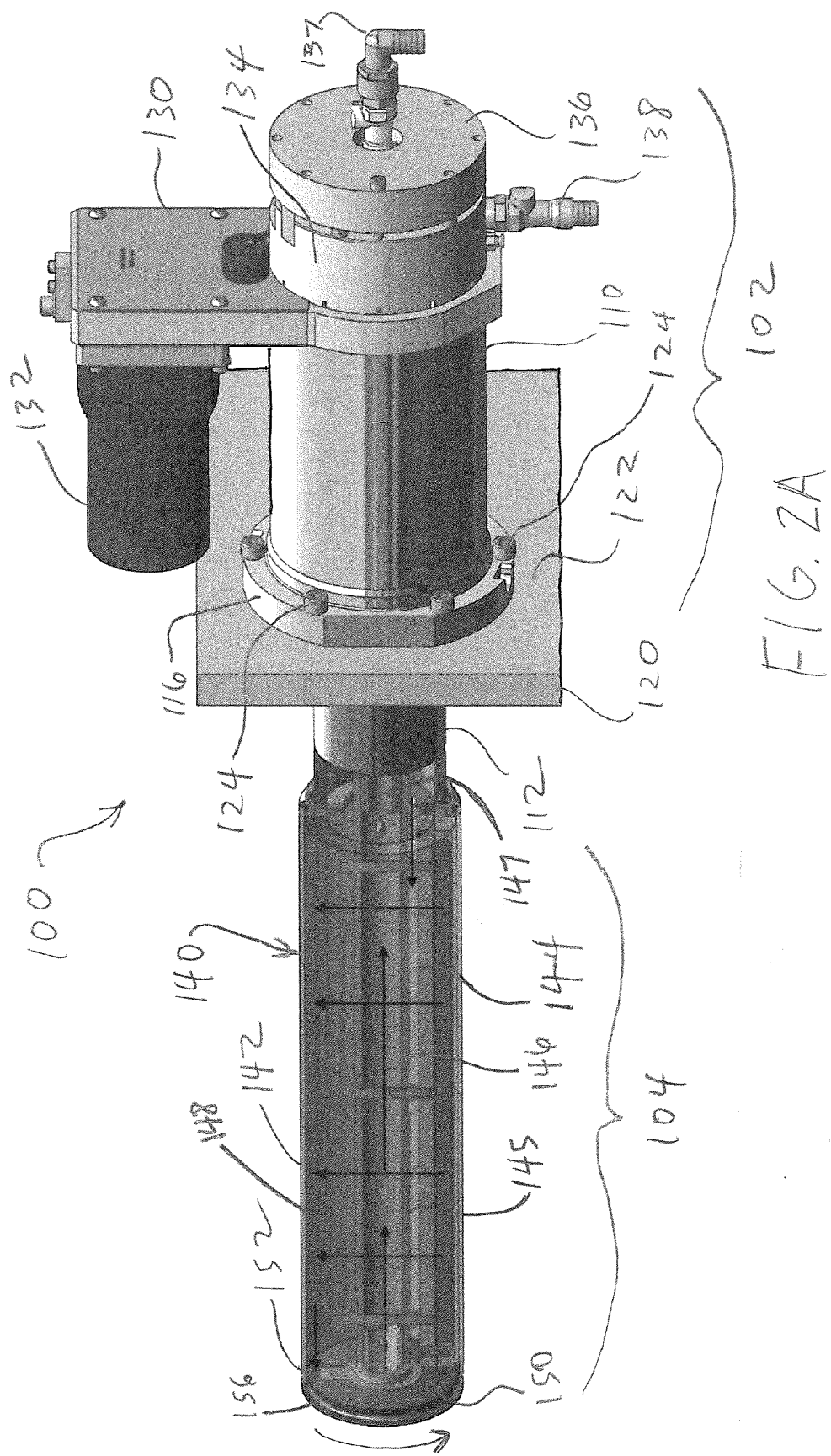
FIGS. 2A and 2B are side mount perspective views of a magnetron sputtering apparatus in a horizontal orientation according to one embodiment of the invention.
Figure 2B:
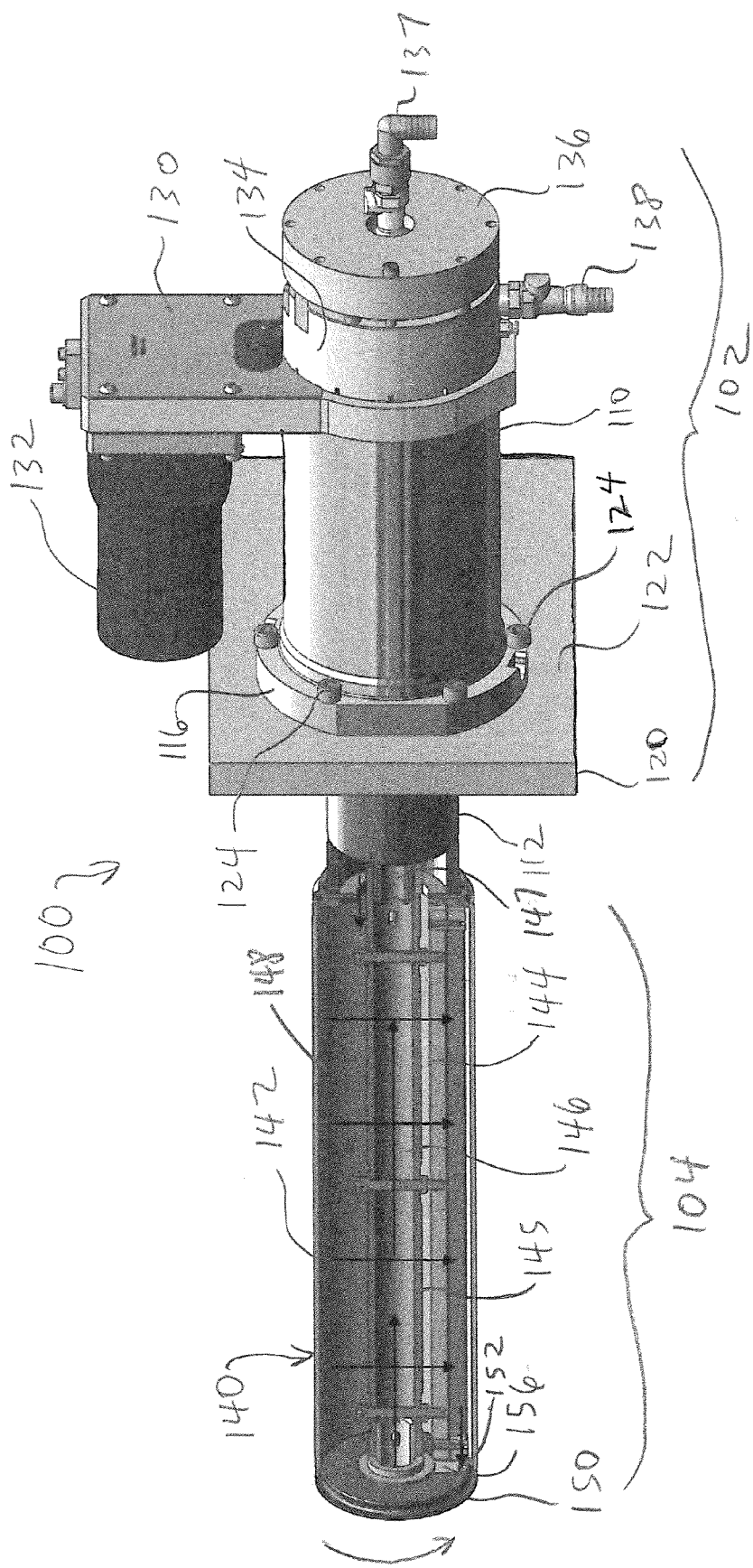

FIGS. 2A and 2B illustrate a magnetron sputtering apparatus 100 that incorporates the present rotary cathode with the coolant routing features according to one embodiment. The magnetron sputtering apparatus 100 generally includes a cathode source assembly 102 and a cathode target section 104 that is removably coupled to the cathode source section 102. The cathode source assembly 102 is placed in a side-mounted position such that the cathode target section 104 has a substantially horizontal orientation.

The magnetron sputtering apparatus can also be mounted in other positions to provide for different cathode orientations as described hereafter. For example, the cathode source assembly can be placed in a bottom-mounted position such that the cathode target section extends in an upwardly direction with a distal end of the target cylinder higher than a proximal end of the target cylinder. The cathode source assembly can also be placed in a top-mounted position such that the cathode target section extends in a downwardly direction with the distal end of the target cylinder lower than the proximal end of the target cylinder.

Referring to FIGS. 2A and 2B, cathode source assembly 102 includes a bearing housing 110 that surrounds a hollow drive shaft 112. The drive shaft 112 protrudes from bearing housing 110 into a vacuum coating chamber enclosed by a side wall 120. The bearing housing 110 has an outer flange 116 at one end that abuts against an outer surface 122 of side wall 120. The bearing housing 110 is secured to side wall 120 by a plurality of bolts 124 that extend through outer flange 116 and into side wall 120.

The magnetron sputtering apparatus 100 has a single end feed-thru in bearing housing 110 such that all utilities are introduced into the feed-thru. A drive housing 130 is secured at an opposite end of bearing housing 110 from outer flange 116. A motor 132 is mounted on drive housing 130, which surrounds a drive belt (not shown). A water seal housing 134 is secured to drive housing 130, and a high voltage cover 136 is attached to water seal housing 134. A rear fluid port 137 extends though high voltage cover 136 and a side fluid port 138 extends thru water seal housing 134. The fluid ports 137 and 138 are configured to couple with sources of water and air (now shown) when needed during operation of magnetron sputtering apparatus 100.

A rotary cathode 140 is removably mounted to an end portion of drive shaft 112 that protrudes into the vacuum coating chamber through side wall 120. The rotary cathode 140 includes a rotatable target cylinder 142 having a target material on an outer surface thereof. A non-rotatable magnet array 144 is suspended inside of target cylinder 142 and is supported by a non-rotatable interior structure 145 such as a tube. The interior structure 145 extends from a proximal end to a distal end of target cylinder 142. The interior structure 145 has an outer surface with no openings, and an inner passageway 146 that communicates with a coolant conduit 147 that extends from within drive shaft 112.

An outer passageway 148 is defined between the inner surface of target cylinder 142 and the outer surface of interior structure 145. The outer passageway 148 is in fluid communication with a rotary feed-thru in drive shaft 112. An end cap 150 is affixed at the distal end of target cylinder 142.

A rotatable fluid directing aperture 152 is defined at the junction of end cap 150 and target cylinder 142, along an inner edge of target cylinder 142. A fluid pathway 160 defined by end cap 150 provides fluid communication between outer passageway 148 and inner passageway 146 through aperture 152.

The size of aperture 152 can be adjusted with use of a cover 156 that slides into a groove in end cap 150. The cover 156 can be easily removed from end cap 150 and replaced with a different cover to modify the size of aperture 152, for increasing or decreasing water flow, for example.

The water flow direction through cathode target cylinder 142 is important to ensure proper target cooling. For example, with magnetron sputtering apparatus 100 operating in the horizontal orientation shown in FIGS. 2A and 2B, the water fill and blow down air sources should be connected to side port 138 to provide optimal performance.

Figure 3:
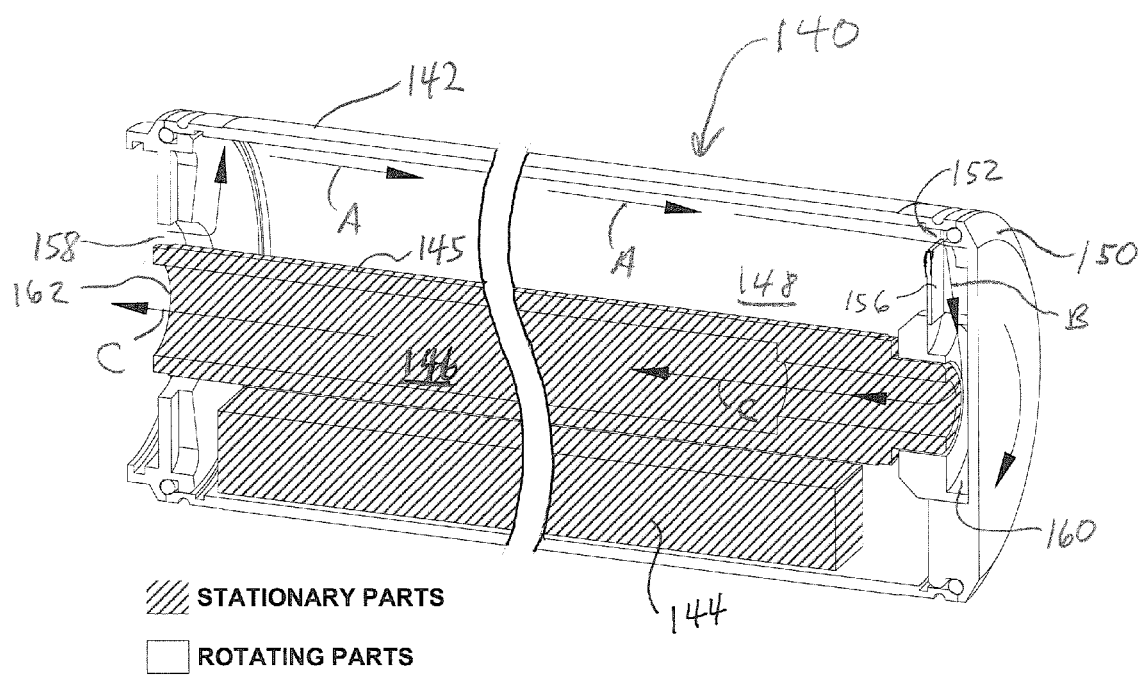
FIG. 3 is a cross-sectional perspective view of a rotary cathode used in the magnetron sputtering apparatus of FIGS. 2A and 2B.

FIG. 3 is an enlarged cross-sectional view of rotary cathode 140 used in the magnetron sputtering apparatus 100, showing the routing scheme for a fluid such as water or air as utilized in the present method for a horizontal orientation of cathode 140. The water or air is directed thru an inlet 158 of target cylinder 142 and into outer passageway 148 (arrows A). The water or air flows thru aperture 152 past cover 156 and into a pathway 160 in end cap 150 (arrow B). The water or air then travels thru inner passageway 146 and exits at an outlet 162 of interior structure 145 (arrows C). The water/air routing scheme shown in FIG. 3 substantially eliminates all air pockets or trapped water in target cylinder 142.

Figure 4A:
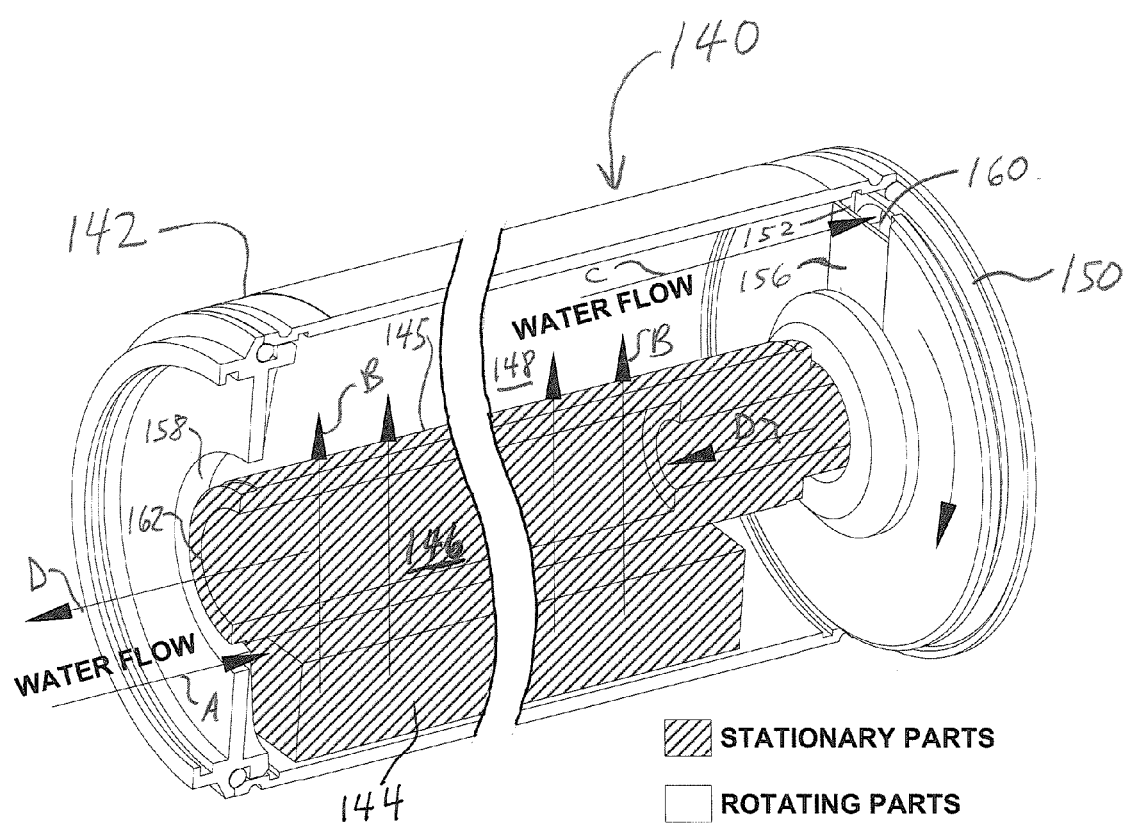
FIGS. 4A and 4B are additional cross-sectional perspective views of the rotary cathode used in the magnetron sputtering apparatus of FIGS. 2A and 2B.
Figure 4B:
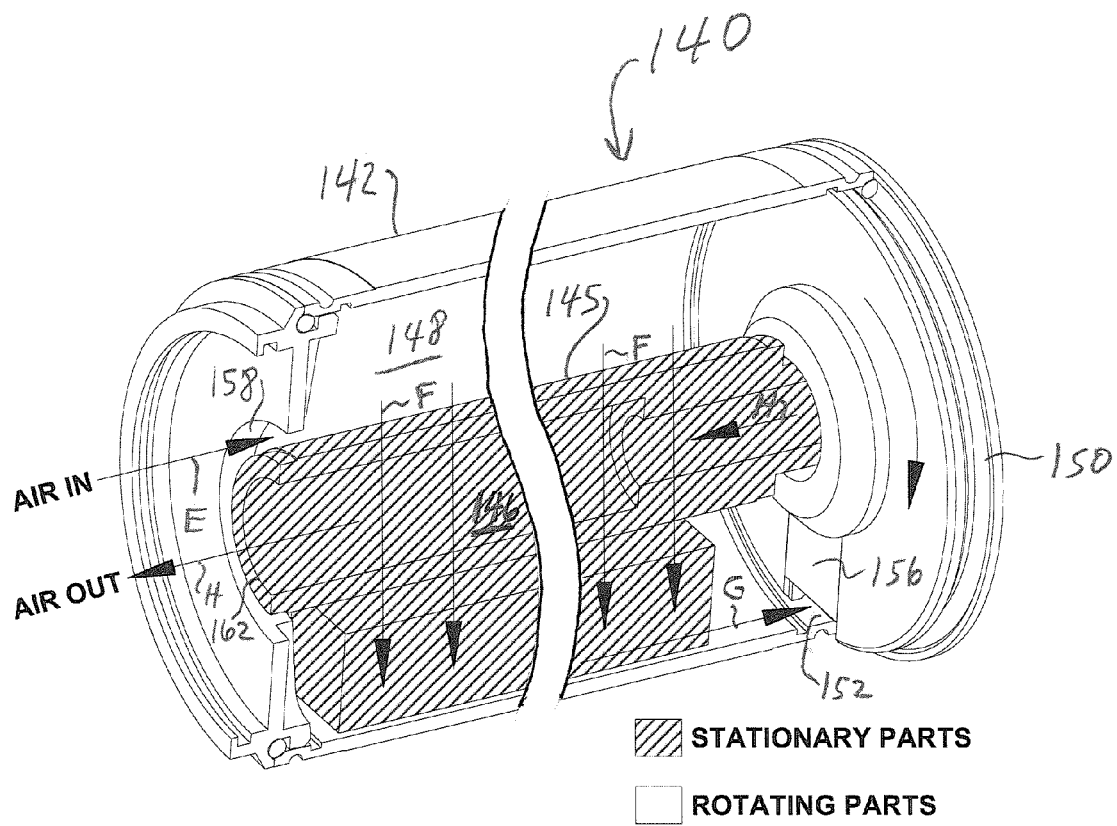

FIGS. 4A and 4B are additional cross-sectional views of rotary cathode 140 used in the magnetron sputtering apparatus 100, showing the water fill and blow down techniques of the present approach in further detail. During a water fill operation, the water flow is directed thru inlet 158 and into outer passageway 148 of target cylinder 142 (arrow A) as depicted in FIG. 4A. The water completely fills target cylinder 142 (arrows B), and then flows thru aperture 152 past cover 156 and into pathway 160 in end cap 150 (arrow C). The water then travels thru inner passageway 146 and exits at outlet 162 of interior structure 145 (arrows D).

The water fill operation is also illustrated in FIG. 2A with the directional arrows in cathode 140. The water is directed thru hollow drive shaft 112 and into outer passageway 148 of the target cylinder 142. The water flows thru aperture 152 and into inner passageway 146, with the water flowing back toward the proximal end of target cylinder 142 and into coolant conduit 147.

During the water fill operation, all air is quickly removed from target cylinder 142 as it rotates, with any air bubbles exiting through aperture 152 in end cap 150. By providing for total water fill in target cylinder 142, the present approach allows for better cooling and higher power in a sputtering process, as well as higher productivity during the process. In addition, the risk of target damage due to a cathode rotation stop is greatly reduced.

During a blow down operation, compressed air is directed thru inlet 158 and into outer passageway 148 of target cylinder 142 (arrow E) as shown in FIG. 4B. The compressed air forces the water completely out of passageway 148 (arrows F) and thru aperture 152 in end cap 150 past cover 156 (arrow G). The compressed air then forces the water thru inner passageway 146 to outlet 162 of interior structure 145 (arrows H).

The blow down operation is also illustrated in FIG. 2B with the directional arrows in cathode 140. The air is directed thru hollow drive shaft 112 and into outer passageway 148 of target cylinder 142. The air flows thru aperture 152 and into inner passageway 146, with the air flowing back toward the proximal end of target cylinder 142 and into coolant conduit 147.

As shown in FIG. 4B, the blow down air has the same routing scheme as the water fill shown in FIG. 4A. During the blow down operation, all of the water is quickly removed from target cylinder 142 as aperture 152 in end cap 150 rotates thru the trapped water volume. By removing all of the water this way, the problems of having trapped water in the cathode as in the typical routing methods are eliminated.

Vertical Cathode Orientation—Bottom Mount

When a conventional magnetron sputtering apparatus is mounted from the bottom in a vertical or angled cathode orientation, similar problems occur with respect to trapped air in the cathode during a water fill operation as described previously for the horizontal cathode orientation.

Figure 5:
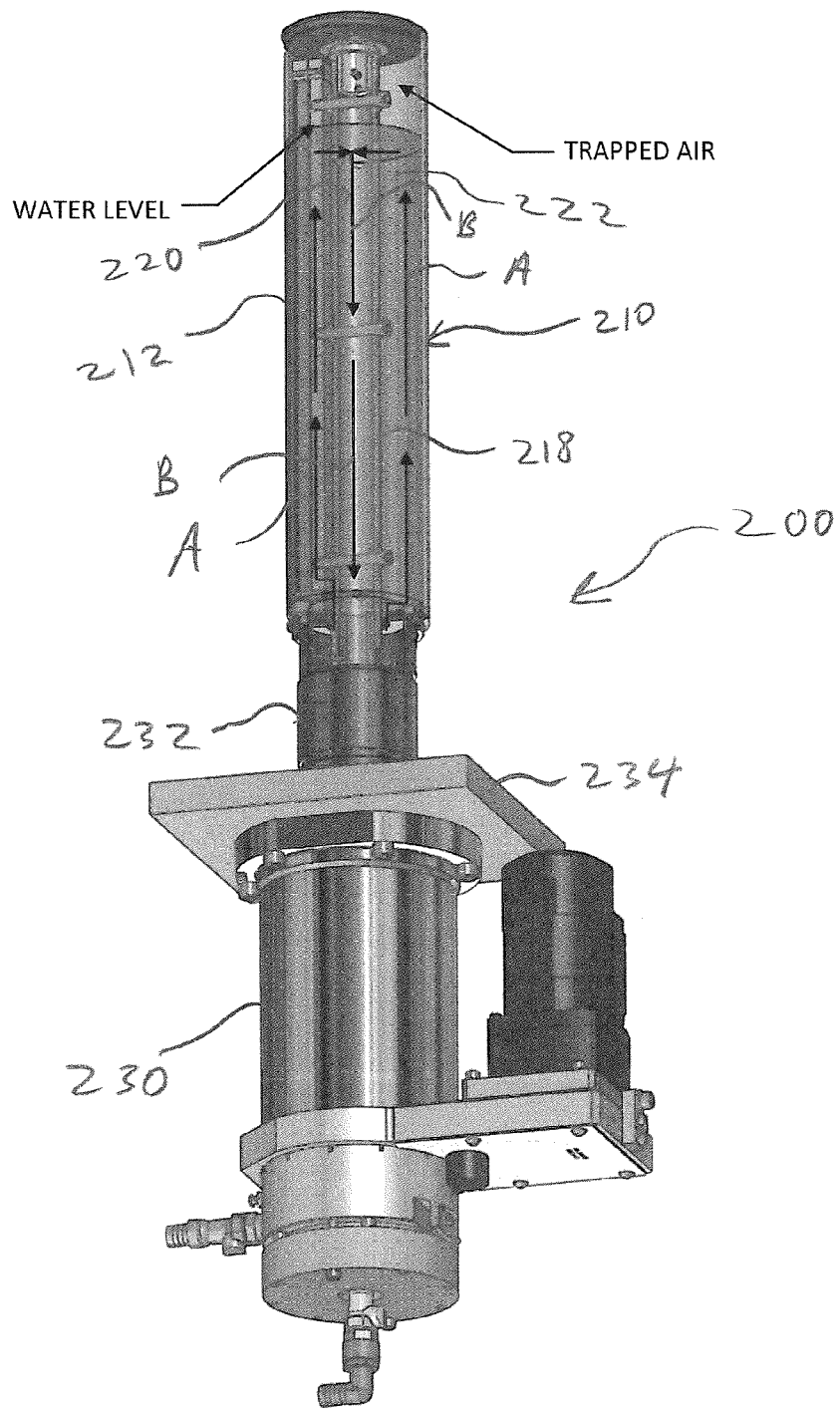
FIG. 5 is a bottom mount perspective view of a magnetron sputtering apparatus in a vertical orientation that has a conventional rotary cathode.

For example, FIG. 5 shows a magnetron sputtering apparatus 200 in a bottom-mounted position with a conventional rotary cathode 210 in a vertical orientation. The cathode 210 includes similar features as cathode 10 shown in FIGS. 1A and 1B and described above. Thus, cathode 210 includes a cylindrical target tube 212 with a target material on an outer surface thereof. The target tube 212 is rotated around a non-rotatable magnet array supported inside of target tube 212 by a central tube 218 having an inner passageway 220. An outer passageway 222 is defined between the inner surface of target tube 212 and the outer surface of central tube 218. A plurality of holes toward a distal end of central tube 218 provides fluid communication between inner passageway 220 and outer passageway 222.

The other components of magnetron sputtering apparatus 200 are the same as those described previously for sputtering apparatus 100, and include a bearing housing 230 that partially surrounds a hollow drive shaft 232. The rotary cathode 210 is mounted to an end of drive shaft 232 that protrudes into a vacuum coating chamber through a side wall 234 of the coating chamber.

In a conventional method of filling rotary cathode 210 with water, the water flow is routed thru outer passageway 222

(arrows A) as shown in FIG. 5. The water passes thru the holes in central tube 218 and flows thru inner passageway 220 toward bearing housing 230 (arrows B). As depicted in FIG. 5, target tube 212 is not completely filled with water, having a pocket of trapped air in a top portion thereof.

Figure 6A:
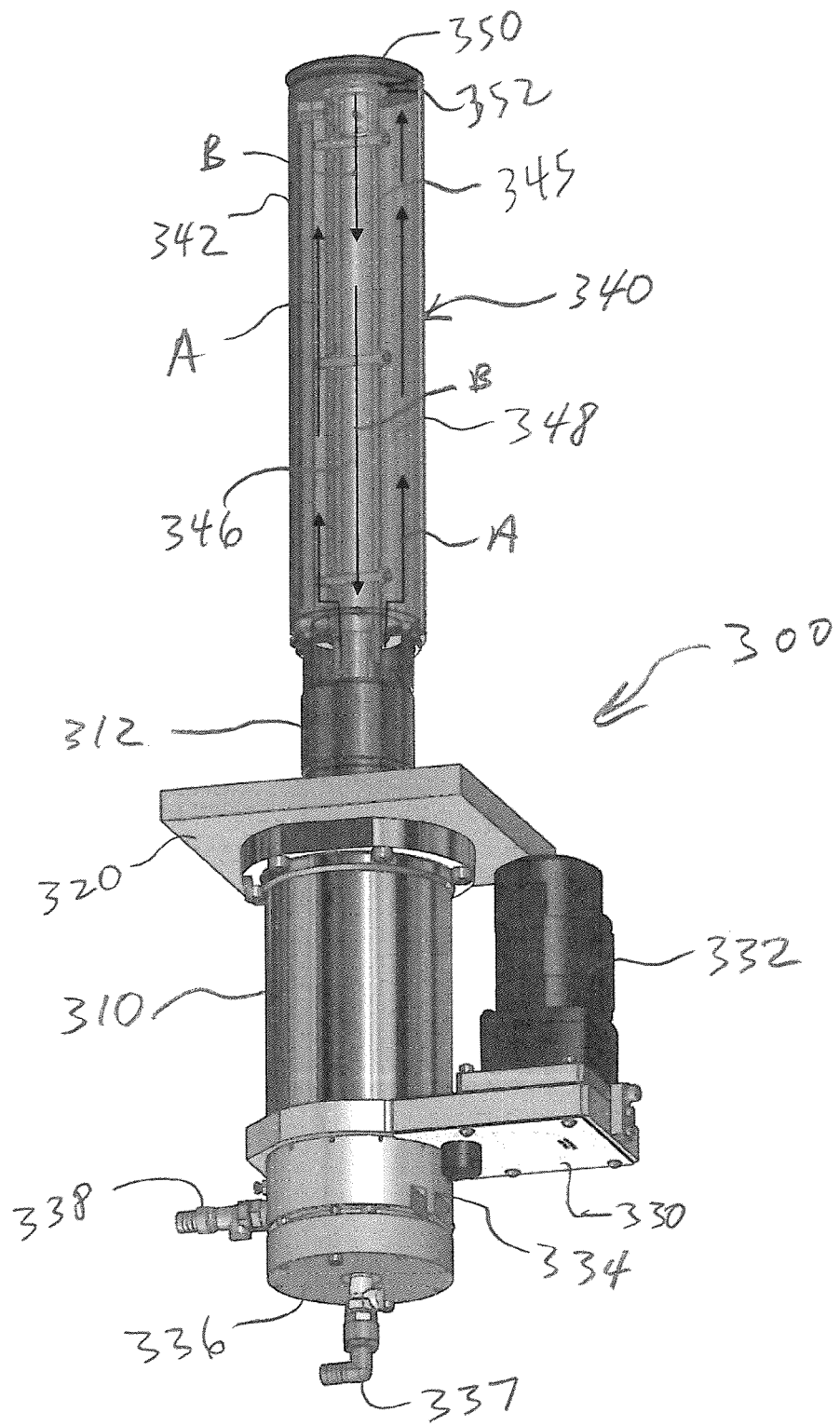
FIGS. 6A and 6B are bottom mount perspective views of a magnetron sputtering apparatus in a vertical orientation according to another embodiment of the invention.
Figure 6B:
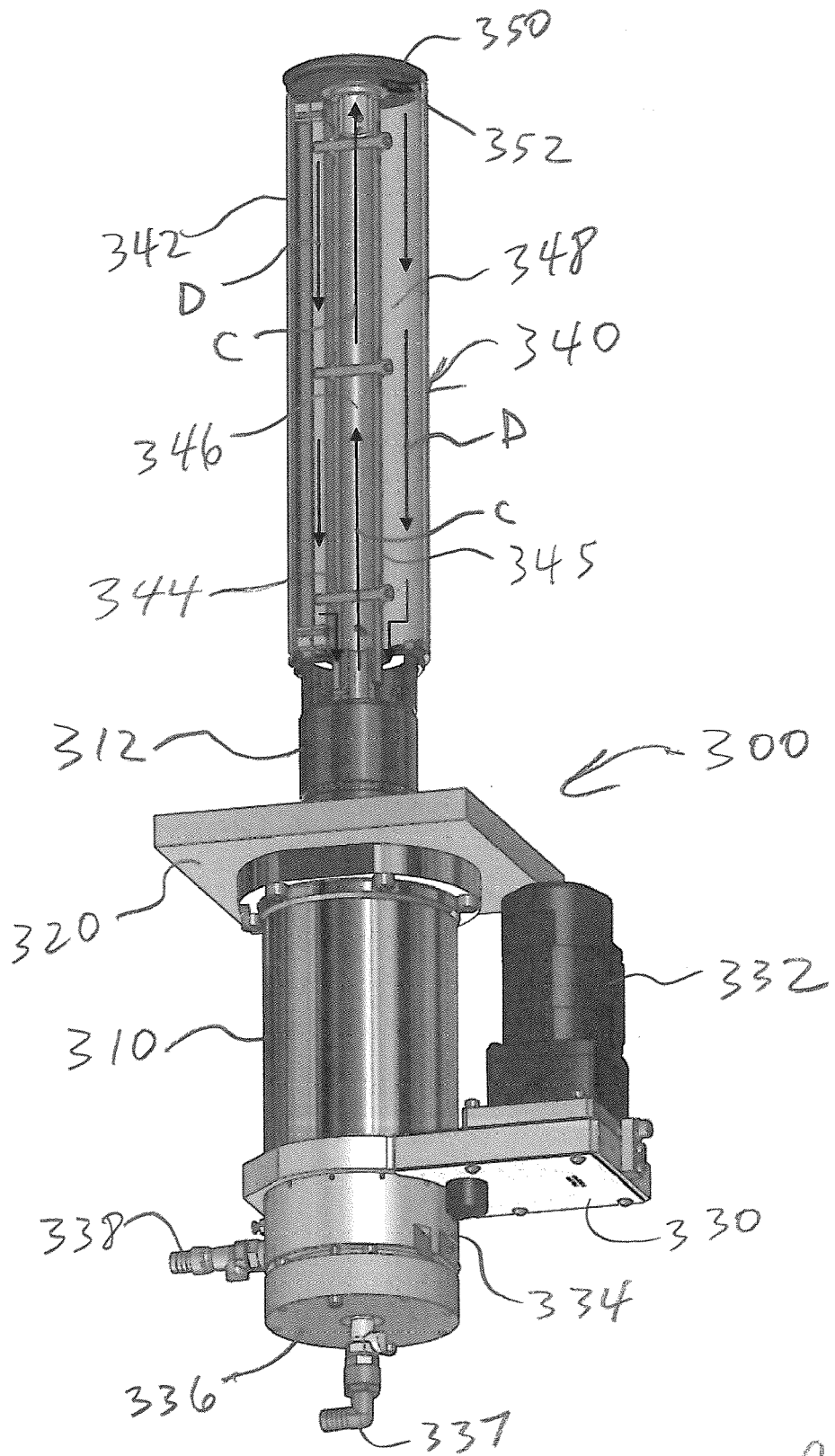

FIGS. 6A and 6B illustrate a magnetron sputtering apparatus 300 in a bottom mounted position with a rotary cathode in a vertical orientation according to another embodiment of the invention. The magnetron sputtering apparatus 300 overcomes the trapped air problem of the conventional cathode shown in FIG. 5, and includes essentially the same components as sputtering apparatus 100 described above. Thus, magnetron sputtering apparatus 300 generally includes a bearing housing 310 that partially surrounds a hollow drive shaft 312. A drive housing 330 is secured to bearing housing 310, and a motor 332 is mounted on drive housing 330. A water seal housing 334 is secured to drive housing 330, and a high voltage cover 336 is attached to water seal housing 334. A rear fluid port 337 extends though high voltage cover 336, and a side fluid port 338 extends thru water seal housing 334.

A rotary cathode 340 is removably mounted to an end of drive shaft 312 that protrudes up into a vacuum coating chamber through a bottom wall 320 of the coating chamber. The rotary cathode 340 includes a target cylinder 342 having target material on an outer surface thereof. A non-rotatable magnet array 344 is suspended inside of target cylinder 342 and is supported by an interior structure 345 having an inner passageway 346. An outer passageway 348 is defined between the inner surface of target cylinder 342 and the outer surface of interior structure 345. An end cap 350 is affixed at the distal end of target cylinder 342. The end cap 350 has an aperture 352 along an inner edge of end cap 350. The aperture 352 provides fluid communication between outer passageway 348 and inner passageway 346

During a water fill operation, the water flow is directed up into outer passageway 348 of target cylinder 342 (arrows A) as depicted in FIG. 6A. The water completely fills outer passageway 348 and flows thru aperture 352 into inner passageway 346 of interior structure 345. The water flows back down inner passageway 346 and exits target cylinder 342 (arrows B).

During a blow down operation, compressed air is directed into inner passageway 346 of interior structure 345 (arrows C) as shown in FIG. 6B. The compressed air passes thru aperture 352 and forces the water completely out of passageway 348 (arrows D). It should be noted that the blow down air is routed in an opposite direction from that of the water flow shown in FIG. 6A.

When operating the rotary cathode in a bottom-mounted vertical orientation, the water source should be coupled to side fluid port 338 to ensure that the cathode is completely full of water during operation. The air flow during a blow down operation should go into rear fluid port 337 to push all of the water out of the cathode.

Vertical Cathode Orientation—Top Mount

When a conventional magnetron sputtering apparatus is mounted from the top in a vertical or angled cathode orientation, similar problems occur with respect to trapped water in the cathode during a blow down operation as described previously for the horizontal cathode orientation.

Figure 7:
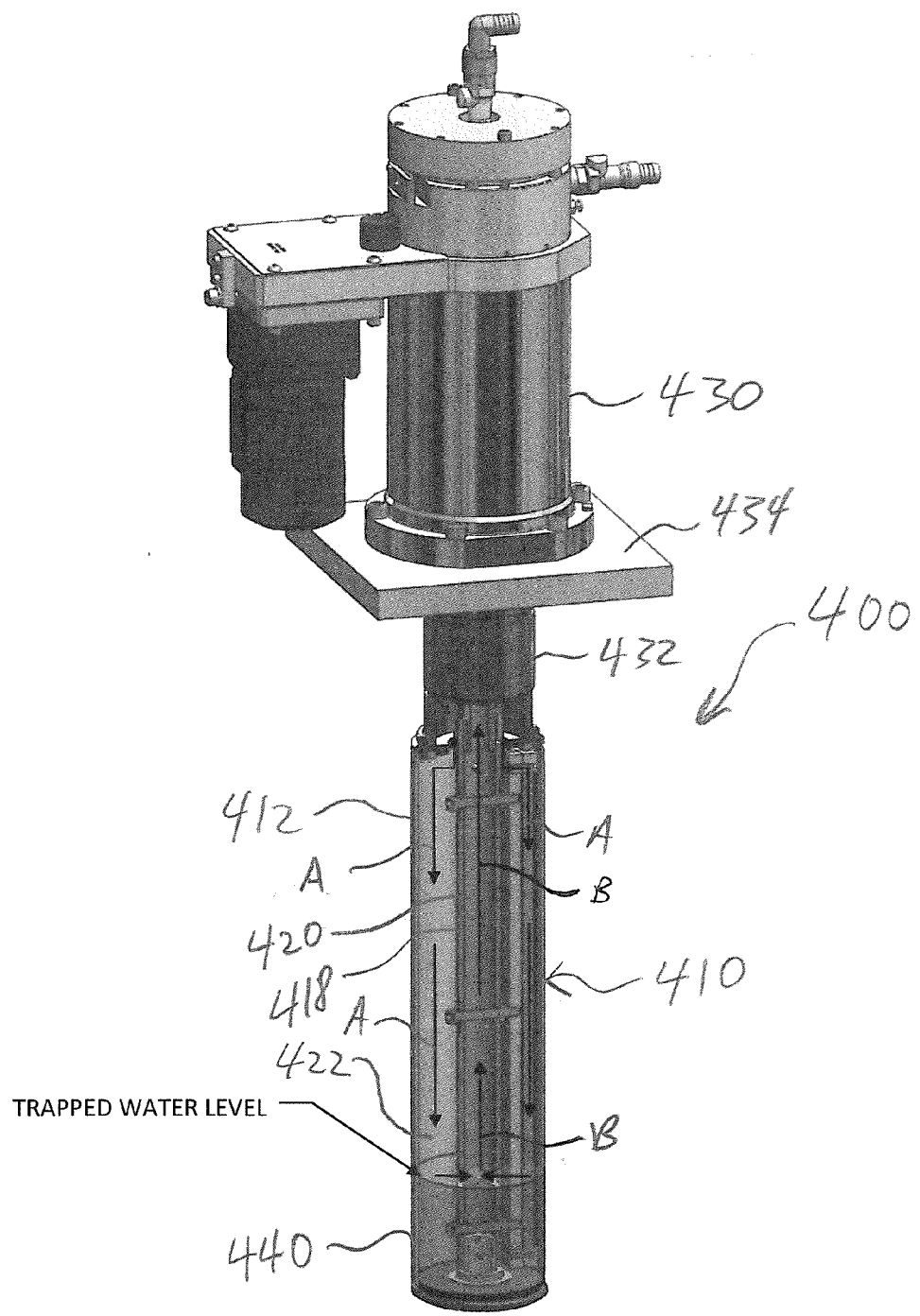
FIG. 7 is a top mount perspective view of a magnetron sputtering apparatus in a vertical orientation that has a conventional rotary cathode.

For example, FIG. 7 illustrates a magnetron sputtering apparatus 400 in a top mount position with a conventional rotary cathode in a vertical orientation. The magnetron sputtering apparatus 400 includes the same components as discussed above for sputtering apparatus 200, including a rotary cathode 410 having a cylindrical target tube 412 with a target material on an outer surface thereof. The target tube 412 is rotated around a non-rotatable magnet array supported inside of target tube 412 by a central tube 418 having an inner passageway 420. An outer passageway 422 is defined between the inner surface of target tube 412 and the outer surface of central tube 418. A plurality of holes toward a distal end of central tube 418 provides fluid communication between inner passageway 420 and outer passageway 422. The rotary cathode 410 is mounted to an end of a drive shaft 432 that protrudes down into a vacuum coating chamber through a top wall 434 of the coating chamber.

In a conventional blow down operation for removing water, compressed air is routed thru outer passageway 422 (arrows A) as shown in FIG. 7. The water passes thru the holes in central tube 418 and flows thru inner passageway 420 toward a bearing housing 430 (arrows B). As depicted in FIG. 7, the compressed air does not remove all of the water in outer passageway 422, with trapped water remaining in a bottom portion 440 of target tube 412.

Figure 8A:
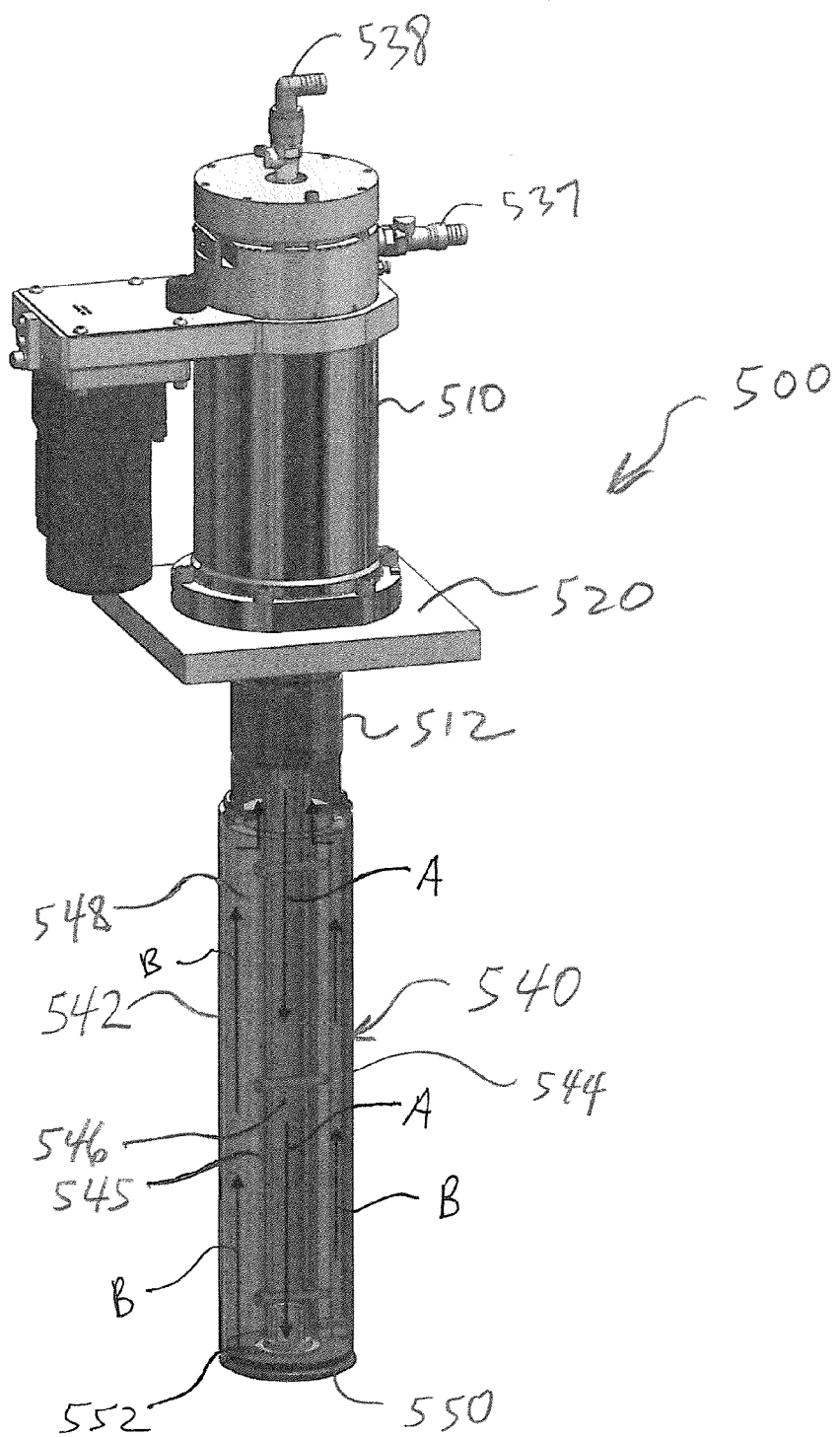
FIGS. 8A and 8B are top mount perspective views of a magnetron sputtering apparatus in a vertical orientation according to a further embodiment of the invention.
Figure 8B:
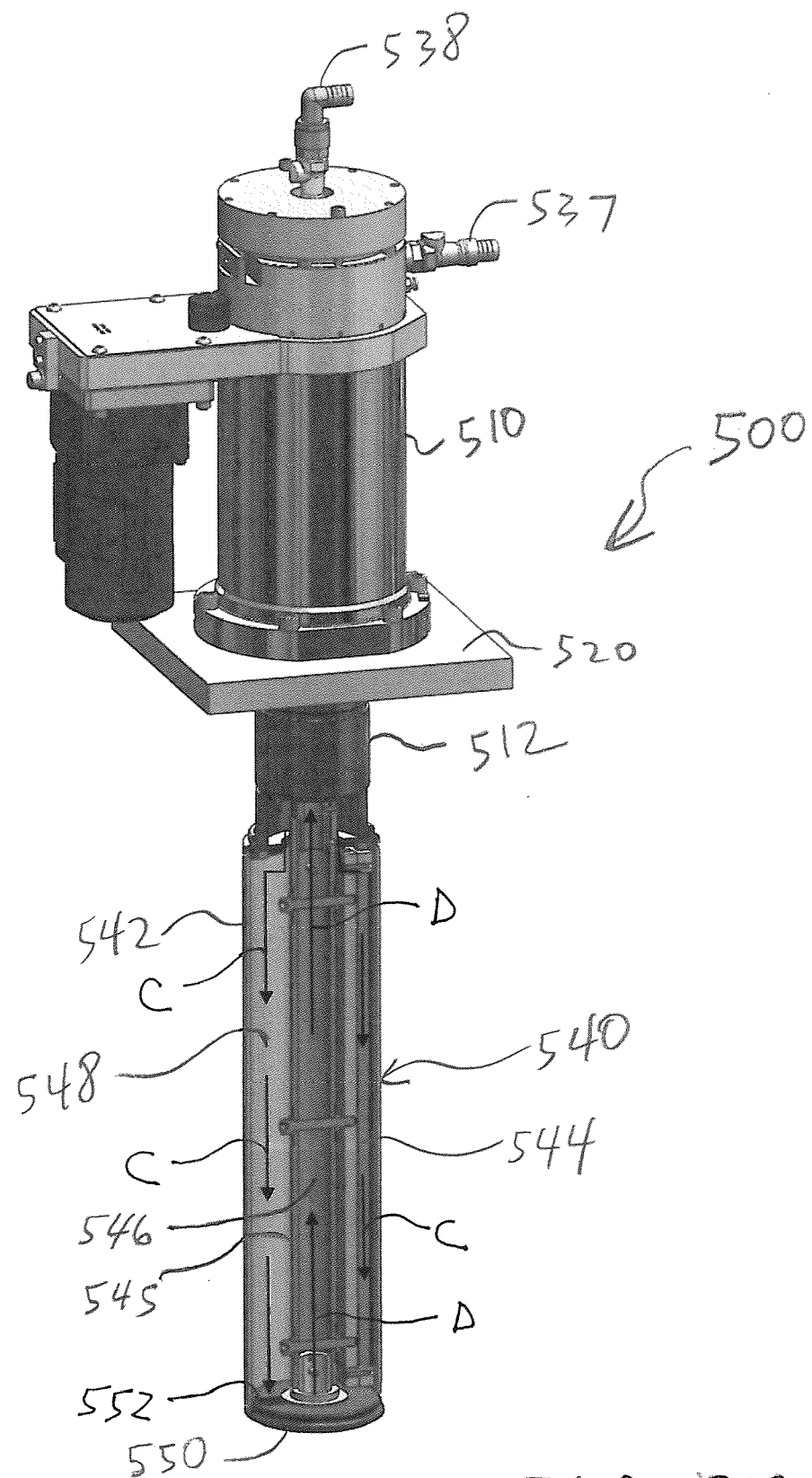

FIGS. 8A and 8B illustrate a magnetron sputtering apparatus 500 in a bottom mounted position with a rotary cathode in a vertical orientation according to another embodiment of the invention. The magnetron sputtering apparatus 500 overcomes the trapped water problem of the conventional cathode shown in FIG. 7, and includes essentially the same components as sputtering apparatus 300 described above. Thus, magnetron sputtering apparatus 500 generally includes a bearing housing 510 that partially surrounds a hollow drive shaft 512.

A rotary cathode 540 is removably mounted to an end of drive shaft 312 that protrudes down into a vacuum coating chamber through a top wall 520 of the coating chamber. The rotary cathode 540 includes a target cylinder 542 having target material on an outer surface thereof. A non-rotatable magnet array 544 is suspended inside of target cylinder 542 and is supported by an interior structure 545 having an inner passageway 546. An outer passageway 548 is defined between the inner surface of target cylinder 542 and the outer surface of interior structure 545. An end cap 550 is affixed at the distal end of target cylinder 542. The end cap 550 has an aperture 552 along an inner edge of end cap 550. The aperture 552 provides fluid communication between outer passageway 548 and inner passageway 546.

During a water fill operation, the water flow is directed into inner passageway 546 of interior structure 545 (arrows A) as shown in FIG. 8A. The water passes thru aperture 552 and completely fills outer passageway 548 (arrows B).

During a blow down operation, compressed air is directed thru outer passageway 548 (arrows C) as shown in FIG. 8B. The compressed air passes thru aperture 552 and forces the water completely out of passageways 548 and 546 (arrows D). The blow down air is routed in an opposite direction from that of the water flow shown in FIG. 8A.

When operating the rotary cathode in a top-mounted vertical orientation, the water source needs to be coupled to a rear port 538 to ensure that the cathode is completely full of water during operation. The air flow during a blow down operation needs to go into a side port 537 to push all of the water out of the cathode.

Figure 9:
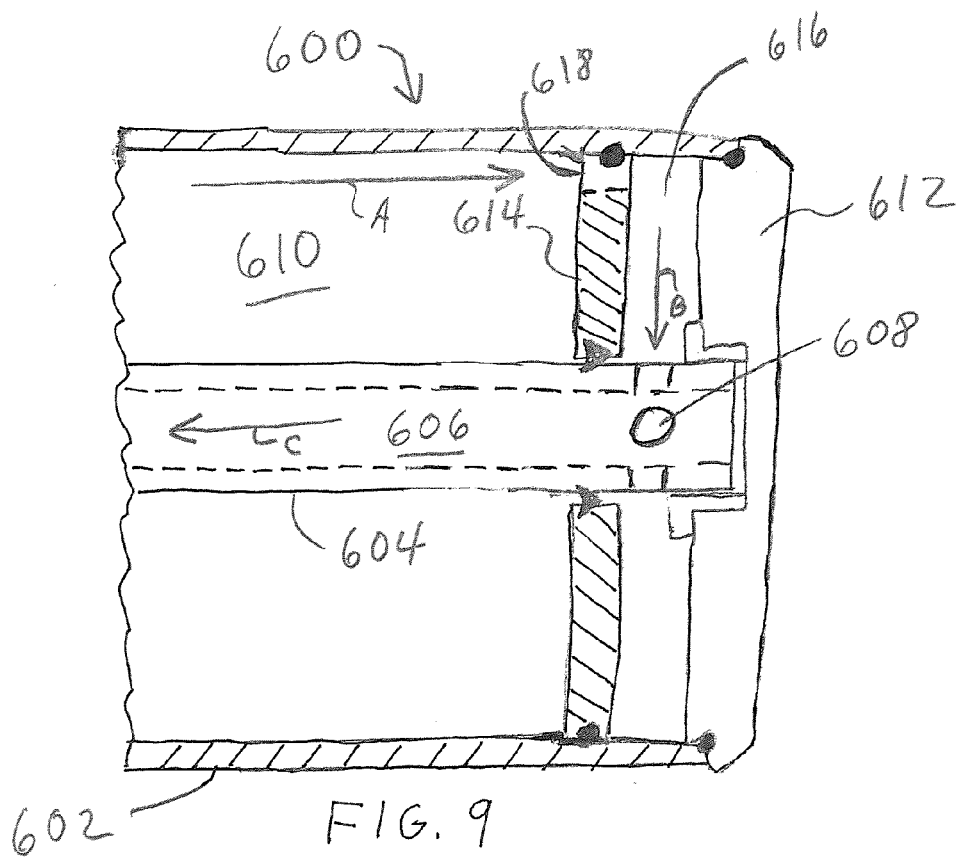
FIG. 9 is a partial cross-sectional view of a rotary cathode according to an alternative embodiment.

FIG. 9 illustrates a rotary cathode 600 that can be used in a magnetron sputtering apparatus according to an alternative embodiment. The cathode 600 is shown as having a substantially horizontal orientation, but can be mounted in other orientations such as those described previously.

The rotary cathode 600 includes a rotatable target cylinder 602 having a target material on an outer surface thereof. An interior structure 604 has an inner passageway 606. The interior structure 604 has one or more openings 608 adjacent the distal end of target cylinder 602. An outer passageway 610 is defined between the inner surface of target cylinder 602 and the outer surface of interior structure 604. An end cap 612 is affixed at the distal end of target cylinder 602. The interior structure 604 extends to the distal end of target cylinder 602 and into end cap 612.

A fluid directing disc 614 is disposed within outer passageway 610 adjacent to and spaced apart from end cap 612. The disc 614 surrounds interior structure 604, and rotates with target cylinder 602 during operation. A fluid pathway 616 is defined between disc 614 and end cap 612. The disc 614 has an aperture 618 that provides fluid communication between outer passageway 610 and pathway 616. The openings 608 are positioned close enough to the end cap 612 to prevent trapped fluid from remaining in pathway 616.

During operation of rotary cathode 600, a fluid, such as water or air, flows via outer passageway 610 (arrow A) through aperture 618 and into pathway 616. The fluid then flows via pathway 616 into inner passageway 606 via opening 608 of interior structure 604 (arrow B). The fluid then travels thru inner passageway 606 (arrow C) to exit cathode 600. In some other orientations, the fluid flow path may be reversed as needed.

Figure 10:
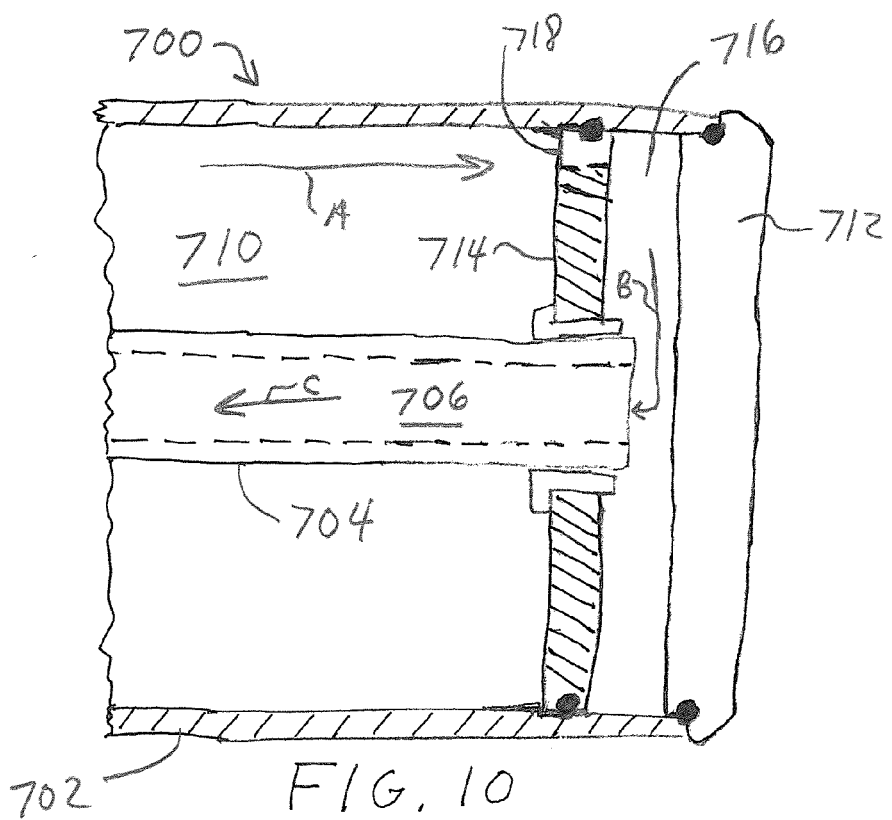
FIG. 10 is a partial cross-sectional view of a rotary cathode according to another alternative embodiment.

FIG. 10 illustrates a rotary cathode 700 that can be used in a magnetron sputtering apparatus according to another alternative embodiment. The cathode 700 is shown as having a substantially horizontal orientation, but can be mounted in other orientations such as those described previously.

The rotary cathode 700 includes a rotatable target cylinder 702 having a target material on an outer surface thereof. An interior structure 704 extends toward a distal end of target cylinder 702 and has an inner passageway 706. An outer passageway 710 is defined between the inner surface of target cylinder 702 and the outer surface of interior structure 704. An end cap 712 is affixed at the distal end of target cylinder 702.

A fluid directing disc 714 is disposed within outer passageway 710 and surrounds a distal end of interior structure 704. Both disc 714 and the distal end of interior structure 704 are adjacent to and spaced apart from end cap 712. The disc 714 rotates with target cylinder 702 during operation. A fluid pathway 716 is defined between disc 714 and end cap 712. The disc 714 has an aperture 718 that provides fluid communication between outer passageway 710 and pathway 716. The distal end of interior structure 704 is positioned close enough to end cap 712 to prevent trapped fluid from remaining in pathway 716.

During operation of rotary cathode 700, a fluid, such as water or air, flows via outer passageway 710 (arrow A) through aperture 718 and into pathway 716. The fluid then flows via pathway 716 into inner passageway 706 via an opening in the distal end of interior structure 604 (arrow B). The fluid then travels thru inner passageway 706 (arrow C) to exit cathode 700. In some other orientations, the fluid flow path may be reversed as needed.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A rotary cathode for a magnetron sputtering apparatus, the rotary cathode comprising:

a rotatable target cylinder with an outer surface and an inner surface, the target cylinder having a proximal end and a distal end;

a non-rotatable interior structure in the target cylinder and extending from the proximal end to the distal end, the interior structure having an outer surface and an inner passageway;

an outer passageway defined between the inner surface of the target cylinder and the outer surface of the interior structure;

an end cap affixed at the distal end of the target cylinder, the end cap having a radial outer edge;

an aperture partially defined at a junction of the radial outer edge of the end cap and the inner surface of the target cylinder, the aperture configured to direct a fluid toward the inner surface of the target cylinder at the distal end; and a fluid pathway at least partially defined by the end cap, the pathway providing fluid communication between the outer passageway and the inner passageway through the aperture;

wherein the aperture changes position along the radial outer edge of the end cap with respect to the non-rotatable interior structure as the target cylinder rotates.

2. The rotary cathode of claim 1, wherein the target cylinder includes a target material on the outer surface thereof.

3. The rotary cathode of claim 1, wherein the target cylinder comprises a target material.

4. The rotary cathode of claim 1, further comprising a magnet array in the target cylinder that is supported by the interior structure.

5. The rotary cathode of claim 1, further comprising a cover that slidably fits into a groove in the end cap adjacent to the aperture, the cover configured to adjust a size of the aperture.

6. The rotary cathode of claim 1, wherein the aperture is defined by a rotatable fluid directing disc disposed in the outer passageway toward the distal end of the target cylinder and surrounding the interior structure, the disc adjacent to and spaced apart from the end cap.

7. The rotary cathode of claim 6, wherein the fluid pathway is defined between the disc and the end cap.

8. The rotary cathode of claim 7, wherein the interior structure has at least one opening in fluid communication with the pathway.

9. A magnetron sputtering apparatus, comprising:
a cathode source assembly comprising:
a rotatable hollow drive shaft; and
a non-rotatable coolant conduit in the hollow drive shaft; and
a cathode target section removably coupled to the cathode source section, the cathode target section comprising:
a rotatable target cylinder with an outer surface and an inner surface, the target cylinder having a proximal end and a distal end, the target cylinder coupled to the drive shaft;
a non-rotatable interior structure in the target cylinder and extending from the proximal end to the distal end, the interior structure having an outer surface, and an inner passageway in fluid communication with the coolant conduit;
an outer passageway defined between the inner surface of the target cylinder and the outer surface of the interior structure;
a non-rotatable magnet array in the outer passageway and supported by the interior structure; and
an end cap affixed at the distal end of the target cylinder, the end cap having a radial outer edge;

an aperture partially defined at a junction of the radial outer edge of the end cap and the inner surface of the target cylinder, the aperture configured to direct a fluid toward the inner surface of the target cylinder at the distal end; and a fluid pathway at least partially defined by the end cap, the pathway providing fluid communication between the outer passageway and the inner passageway through the aperture;

wherein the aperture changes position along the radial outer edge of the end cap with respect to the non-rotatable interior structure as the target cylinder rotates;

wherein during a coolant fill operation, the cathode target section is filled with a liquid coolant while the target cylinder is rotating such that substantially all trapped gas is removed from the cathode target section; and wherein during a blow down operation, compressed gas is fed into the cathode target section while the target cylinder is rotating such that substantially all trapped liquid coolant is removed from the cathode target section.

10. The apparatus of claim 9, further comprising a cover that slidably fits into a groove in the end cap adjacent to the aperture, the cover configured to adjust a size of the aperture.

11. The apparatus of claim 9, wherein the aperture is defined by a rotatable fluid directing disc disposed in the outer passageway toward the distal end of the target cylinder and surrounding the interior structure, the disc adjacent to and spaced apart from the end cap.

12. The apparatus of claim 11, wherein the fluid pathway is defined between the disc and the end cap.

13. The apparatus of claim 12, wherein the interior structure has at least one opening in fluid communication with the pathway.

* * * * *